United States Patent
Wei

(10) Patent No.: US 11,838,009 B2
(45) Date of Patent: Dec. 5, 2023

(54) POWER CONVERTER HAVING MECHANISM OF DYNAMICALLY CONTROLLING MINIMUM OFF TIME

(71) Applicant: ANPEC ELECTRONICS CORPORATION, Hsinchu (TW)

(72) Inventor: Shih-Chung Wei, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 183 days.

(21) Appl. No.: 17/544,858

(22) Filed: Dec. 7, 2021

(65) Prior Publication Data

US 2023/0114513 A1   Apr. 13, 2023

(30) Foreign Application Priority Data

Oct. 8, 2021   (TW) .................................. 110137427

(51) Int. Cl.
*H02M 1/08*   (2006.01)
*H03K 17/0812*   (2006.01)
*H02M 1/32*   (2007.01)
*H02M 3/158*   (2006.01)
(Continued)

(52) U.S. Cl.
CPC .... *H03K 17/08122* (2013.01); *H02M 1/0009* (2021.05); *H02M 1/08* (2013.01); *H02M 1/32* (2013.01); *H02M 3/158* (2013.01); *H02M 3/1588* (2013.01); *H03K 17/0822* (2013.01)

(58) Field of Classification Search
CPC ......... H03K 17/08122; H03K 17/0822; H03K 17/284; H02M 1/08; H02M 1/32; H02M 3/158; H02M 3/1588; Y02B 70/10
See application file for complete search history.

(56) References Cited

U.S. PATENT DOCUMENTS

| | | | |
|---|---|---|---|
| 8,018,694 B1* | 9/2011 | Wu | H02M 1/32 361/18 |
| 2004/0169979 A1* | 9/2004 | Pai | H02M 3/1588 361/18 |
| 2008/0037807 A1 | 2/2008 | Honda | |

(Continued)

FOREIGN PATENT DOCUMENTS

JP   2014150675 A   *   8/2014

*Primary Examiner* — Kyle J Moody
*Assistant Examiner* — Jye-June Lee
(74) *Attorney, Agent, or Firm* — Li & Cai Intellectual Property Office

(57) ABSTRACT

A power converter having a mechanism of dynamically controlling a minimum off time is provided. A high-side overcurrent protecting circuit determines whether or not a current flows from a high-side switch through a node between a second terminal of the high-side switch and a first terminal of a low-side switch toward an inductor, and determines whether or not the current is larger than a threshold to output a high-side overcurrent detected signal and a high-side overcurrent protecting signal. An off time adjusting circuit outputs a minimum off time signal to a driver circuit according to the high-side overcurrent protecting signal. The driver circuit determines that an overcurrent event occurs when the high-side switch is turned on according to the high-side overcurrent detected signal, and accordingly the driver circuit at least continually turns on the low-side switch during a longer minimum off time of the minimum off time signal.

10 Claims, 3 Drawing Sheets

(51) Int. Cl.
  *H03K 17/082*  (2006.01)
  *H02M 1/00*  (2006.01)

(56) References Cited

U.S. PATENT DOCUMENTS

| | | | | |
|---|---|---|---|---|
| 2010/0253296 A1* | 10/2010 | Huang | ................ | H02M 3/1588 |
| | | | | 323/225 |
| 2022/0302842 A1* | 9/2022 | Ishino | ................ | H02M 3/1588 |
| 2022/0393586 A1* | 12/2022 | Yamakoshi | ........... | H02M 3/158 |

* cited by examiner

POWER CONVERTER HAVING MECHANISM OF DYNAMICALLY CONTROLLING MINIMUM OFF TIME

CROSS-REFERENCE TO RELATED PATENT APPLICATION

This application claims the benefit of priority to Taiwan Patent Application No. 110137427, filed on Oct. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having a mechanism of dynamically controlling a minimum off time.

BACKGROUND OF THE DISCLOSURE

A minimum off time of a low-side switch of a conventional power converter has a constant value. During the minimum off time, a low-side overcurrent protecting circuit detects a current flowing through the low-side switch and determines whether or not the current is larger than a current threshold. That is, the low-side overcurrent protecting circuit determines whether or not an overcurrent event occurs. When the overcurrent event occurs, the low-side switch is kept turned on. The low-side switch is not turned off until the current is smaller than the current threshold.

If the minimum off time is set to be a large value, a system is unstable or a frequency of the system is reduced under normal operation at a specific voltage conversion rate. Therefore, it is usually desirable for the minimum off time to be set as a small value, such that the conventional power converter has sufficient time to perform an operation according to instant transition in a load. However, if the minimum off time is set to be a very small value, the conventional power converter does not have sufficient time to detect an overcurrent. As a result, circuit components of the conventional power converter can easily be damaged due to the overcurrent.

SUMMARY OF THE DISCLOSURE

In response to the above-referenced technical inadequacies, the present disclosure provides a power converter having a mechanism of dynamically controlling a minimum off time. The power converter includes a high-side switch, a low-side switch, a driver circuit, a high-side overcurrent protecting circuit and an off time adjusting circuit. The first terminal of the high-side switch is coupled to a common voltage. The first terminal of the low-side switch is connected to a second terminal of the high-side switch. A node between the second terminal of the high-side switch and the first terminal of the low-side switch is connected to a first terminal of an inductor. A second terminal of the inductor is connected to a first terminal of a capacitor. A second terminal of the capacitor and a second terminal of the low-side switch are grounded. The driver circuit is connected to a control terminal of the high-side switch and a control terminal of the low-side switch. The driver circuit is configured to output a high-side conduction signal to the high-side switch to drive the high-side switch. The driver circuit is configured to output a low-side conduction signal to the low-side switch to drive the low-side switch. The high-side overcurrent protecting circuit is connected to the driver circuit and the node between the second terminal of the high-side switch and the first terminal of the low-side switch. The high-side overcurrent protecting circuit is configured to detect the node to determine whether or not a current flows from the high-side switch through the node toward the inductor. The high-side overcurrent protecting circuit is configured to determine whether or not the current is larger than a first current threshold to output a high-side overcurrent detected signal to the driver circuit and to output a high-side overcurrent protecting signal. The off time adjusting circuit is connected to the high-side overcurrent protecting circuit and the driver circuit. The off time adjusting circuit is configured to determine the minimum off time of a minimum off time signal according to the high-side overcurrent protecting signal and configured to output the minimum off time signal to the driver circuit. When the driver circuit determines that an overcurrent event occurs and the high-side switch is turned on according to the high-side overcurrent detected signal, the driver circuit continually turns on the low-side switch at least during a long minimum off time of the minimum off time signal.

In certain embodiments, the off time adjusting circuit stores a plurality of minimum reference off times. The off time adjusting circuit selects one of the plurality of minimum reference off times according to the high-side overcurrent protecting signal. The off time adjusting circuit outputs the minimum off time signal having the minimum off time that is equal to the one of the plurality of minimum reference off times.

In certain embodiments, the off time adjusting circuit determines a working period and a non-working period of the minimum off time signal according to the high-side overcurrent protecting signal. Then, the off time adjusting circuit outputs the minimum off time signal. The non-working period of the minimum off time signal includes the minimum off time.

In certain embodiments, the off time adjusting circuit stores a first minimum reference off time. When the power converter does not generate the current or the current is not larger than the first current threshold, the off time adjusting circuit outputs the minimum off time signal having the minimum off time that is equal to the first minimum reference off time.

In certain embodiments, the off time adjusting circuit further stores a second minimum reference off time. When the power converter generates the current and the current is larger than the first current threshold, the off time adjusting circuit outputs the minimum off time signal having the minimum off time that is equal to the second minimum reference off time.

In certain embodiments, when the power converter generates the current and the current is larger than the first current threshold, the high-side overcurrent protecting circuit outputs the high-side overcurrent detected signal having a pulse wave and outputs the high-side overcurrent protecting signal having a waveform.

In certain embodiments, a rising edge of the waveform of the high-side overcurrent protecting signal is aligned with a rising edge of the pulse wave of the high-side overcurrent detected signal. A falling edge of the waveform of the high-side overcurrent protecting signal is aligned with a next rising edge of a waveform of the high-side conduction signal.

In certain embodiments, the minimum off time is a time between a time point of a rising edge of the low-side conduction signal and a time point of a rising edge of the minimum off time signal.

In certain embodiments, when the low-side switch receives the low-side conduction signal at a low level, the low-side switch is turned off. When the low-side switch receives the low-side conduction signal at a high level, the low-side switch is turned on.

In certain embodiments, the power converter further includes a low-side overcurrent protecting circuit. The low-side overcurrent protecting circuit is connected to the driver circuit and the node. The low-side overcurrent protecting circuit is configured to determine whether or not a current that flows through the low-side switch, the node and the inductor is larger than a second current threshold, within the minimum off time.

As described above, the present disclosure provides the power converter having the mechanism of dynamically controlling the minimum off time. When the power converter operates normally, the minimum off time of the low-side switch is shorter. However, when the current flowing through the high-side switch is larger than the first current threshold, the overcurrent event occurs. Under this condition, the minimum off time of the low-side switch is longer. When the low-side switch is turned on during the longer minimum off time, the low-side overcurrent protecting circuit has sufficient time to determine whether or not the current flowing through the low-side switch is larger than the second threshold. That is, the low-side overcurrent protecting circuit has sufficient time to determine whether or not the overcurrent event occurs. Therefore, the circuit components of the power converter can be prevented from being damaged due to the overcurrent event.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
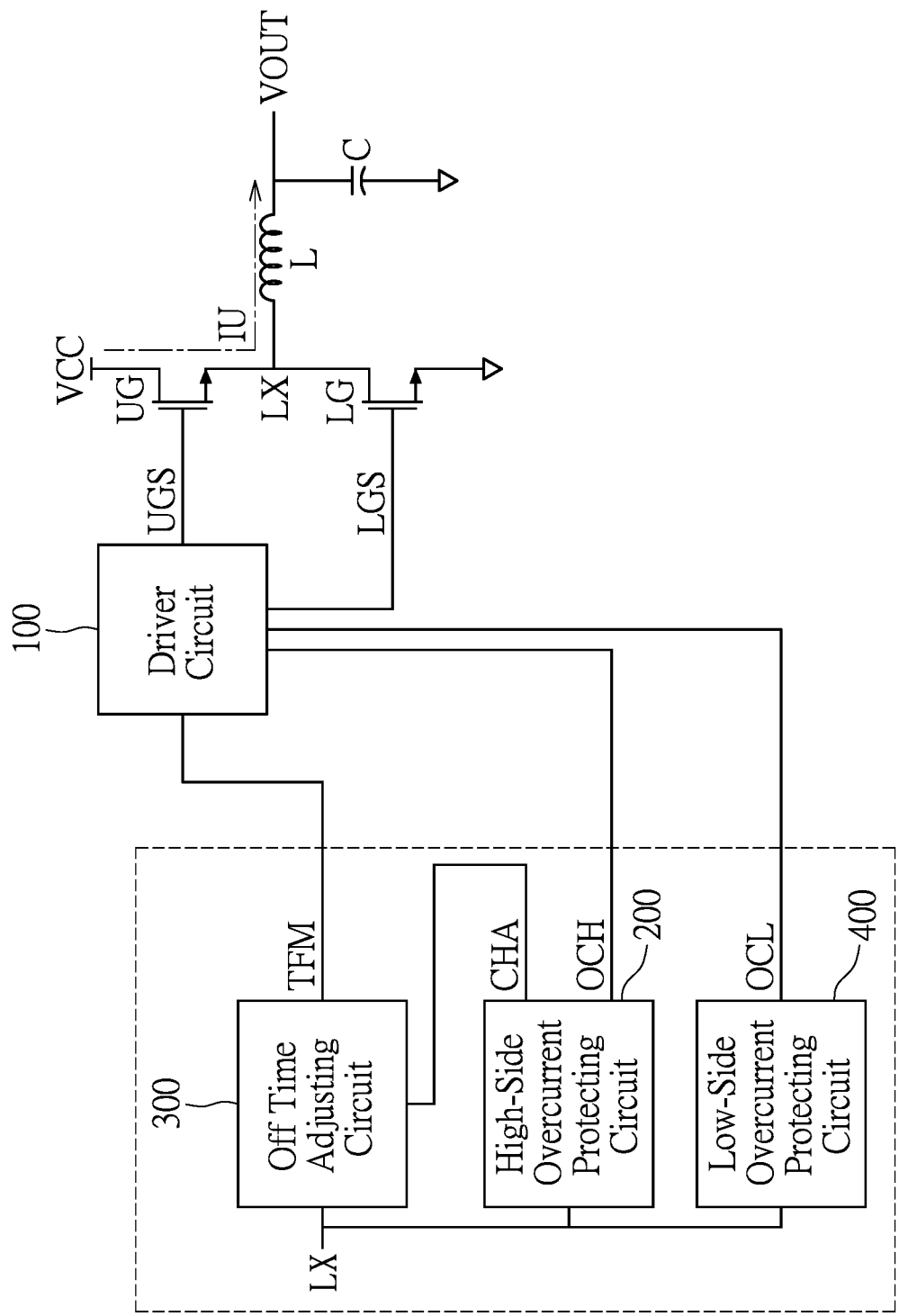
FIG. 1 is a circuit layout diagram of a power converter having a mechanism of dynamically controlling a minimum off time according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
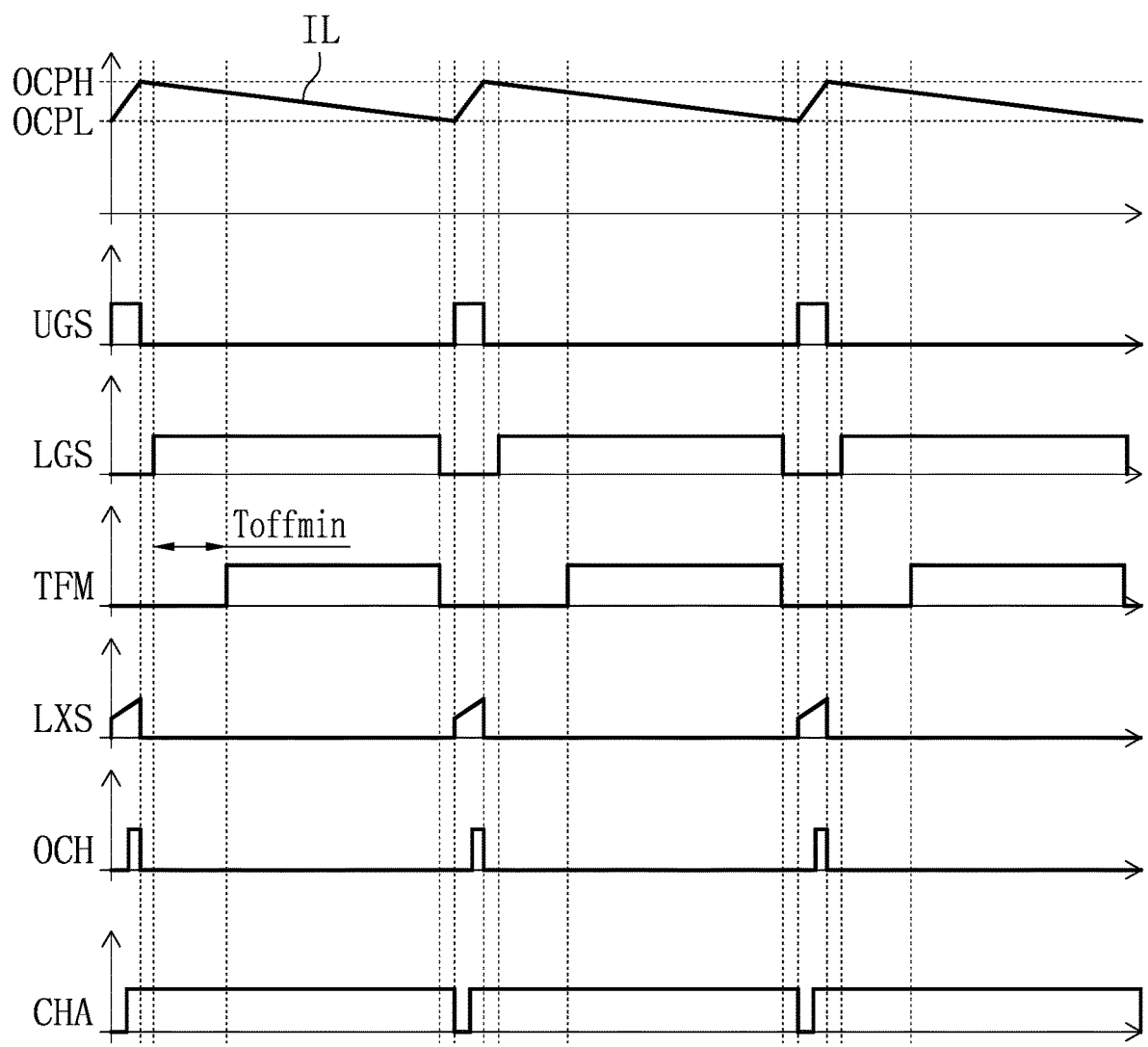
FIG. 3 is a curve diagram of signals of the power converter having the mechanism of dynamically controlling the minimum off time according to the first and second embodiments of the present disclosure.

Reference is made to FIGS. 1 and 3, in which FIG. 1 is a circuit layout diagram of a power converter having a mechanism of dynamically controlling a minimum off time according to a first embodiment of the present disclosure, and FIG. 3 is a curve diagram of signals of the power converter having the mechanism of dynamically controlling the minimum off time according to the first and second embodiments of the present disclosure.

The power converter of the embodiment of the present disclosure may include a high-side switch UG, a low side switch LG, a driver circuit 100, a high-side overcurrent protecting circuit 200, an off time adjusting circuit 300 and a low-side overcurrent protecting circuit 400 as shown in FIG. 1, but the present disclosure is not limited thereto.

A first terminal of the high-side switch UG may be coupled to a common voltage VCC. A second terminal of the high-side switch UG may be connected to a first terminal of the low-side switch LG. A second terminal of the low-side switch LG is grounded. A node LX between the second terminal of the high-side switch UG and the first terminal of the low-side switch LG may be connected to a first terminal of an inductor L. A second terminal of the inductor L may be connected to a first terminal of a capacitor C. A second terminal of the capacitor C is grounded. A node between the second terminal of the inductor L and the first terminal of the inductor L is an output terminal of the power converter.

A driver circuit 100 may be connected to a control terminal of the high-side switch UG and a control terminal of the low-side switch LG. The driver circuit 100 may output a high-side conduction signal UGS to the high-side switch UG to drive the high-side switch UG. For example, when the driver circuit 100 outputs the high-side conduction signal UGS at a high level to the high-side switch UG, the high-side switch UG is turned on. Conversely, when the driver circuit 100 outputs the high-side conduction signal UGS at a low level to the high-side switch UG, the high-side switch UG is turned off.

The driver circuit 100 may output a low-side conduction signal LGS to the low-side switch LG to drive the low-side switch LG. For example, when the driver circuit 100 outputs the low-side conduction signal LGS at a high level to the low-side switch LG, the low-side switch LG is turned on. Conversely, when the driver circuit 100 outputs the low-side conduction signal LGS at a low level to the low-side switch LG, the low-side switch LG is turned off.

The high-side overcurrent protecting circuit 200 may be connected to the driver circuit 100 and the off time adjusting circuit 300. In addition, the high-side overcurrent protecting circuit 200 may be connected to the node LX between the second terminal of the high-side switch UG and the first terminal of the low-side switch LG.

The high-side overcurrent protecting circuit 200 may detect data of the node LX, and generate a node detected signal LXS shown in FIG. 3 according to the detected data of the node LX. The high-side overcurrent protecting circuit 200 may, according to the node detected signal LXS, determine whether or not a current IU flows from the high-side switch UG through the node LX toward the inductor L and determine whether or not the current IU is larger than a first current threshold to output a high-side overcurrent detected signal OCH to the driver circuit 100 and to output a high-side overcurrent protecting signal CHA to the off time adjusting circuit 300.

It is worth noting that, when the high-side overcurrent protecting circuit 200 determines that the power converter generates the current IU and the current IU is larger than the first current threshold, the high-side overcurrent protecting circuit 200 may output the high-side overcurrent detected signal OCH having a pulse wave as shown in FIG. 3 to the driver circuit 100 and output the high-side overcurrent protecting signal CHA having a waveform as shown in FIG. 3 to the off time adjusting circuit 300.

As shown in FIG. 3, a rising edge of the waveform of the high-side overcurrent protecting signal CHA is aligned with a rising edge of the pulse wave of the high-side overcurrent detected signal OCH. A falling edge of the waveform of the high-side overcurrent protecting signal CHA is aligned with a next rising edge of a waveform of the high-side conduction signal UGS. In other words, a time point of the falling edge of the waveform of the high-side overcurrent protecting signal CHA is aligned with a time point at which a current IL of the inductor L discharges to be a low valley current value OCPL.

Each time a rising edge of one of the waveforms of the high-side overcurrent protecting signal CHA is aligned with a rising edge of one of the pulse waves of the high-side overcurrent detected signal OCH, the high-side overcurrent protecting circuit 200 is triggered to store a value of the current IL of the inductor L. Before a rising edge of a next one of the waveforms of the high-side overcurrent protecting signal CHA is aligned with a rising edge of a next one of the pulse waves of the high-side overcurrent detected signal OCH, the stored value is reset to be a zero value.

The off time adjusting circuit 300 may be connected to the driver circuit 100. The off time adjusting circuit 300 may determine a time length of a minimum off time Toffmin of a minimum off time signal TFM according to the high-side overcurrent protecting signal CHA. The off time adjusting circuit 300 then outputs the minimum off time signal TFM to the driver circuit 100. The driver circuit 100 needs to continually turn on the low-side switch LG at least during the minimum off time Toffmin of the minimum off time signal TFM.

As shown in FIG. 3, the minimum off time Toffmin is a time between a time point of a rising edge of the low-side conduction signal LGS and a time point of a rising edge of the minimum off time signal TFM.

For example, the off time adjusting circuit 300 may store a plurality of minimum reference off times. The plurality of minimum reference off times are not equal to each other. When the off time adjusting circuit 300 receives the high-side overcurrent protecting signal CHA from the high-side overcurrent protecting circuit 200, the off time adjusting circuit 300 may, according to a value of the current IU that is indicated by the high-side overcurrent protecting signal CHA, select one of the plurality of minimum reference off times. Then, the off time adjusting circuit 300 may output the minimum off time signal TFM having the minimum off time Toffmin that is equal to the selected reference off time.

For example, the plurality of minimum reference off times stored in the off time adjusting circuit 300 includes a first minimum reference off time and a second minimum reference off time. The second minimum reference off time is longer than the first minimum reference off time.

When the power converter does not generate the current IU or the current IU is not larger than the first current threshold, the off time adjusting circuit 300 outputs the minimum off time signal TFM having the minimum off time Toffmin that is equal to the first minimum reference off time. Conversely, when the power converter does generate the current IU and the current IU is larger than the first current threshold, the off time adjusting circuit 300 outputs the minimum off time signal TFM having the minimum off time Toffmin that is equal to the second minimum reference off time.

The low-side overcurrent protecting circuit 400 may be connected to the driver circuit 100. In addition, the low-side overcurrent protecting circuit 400 may be connected to the node LX between the second terminal of the high-side switch UG and the first terminal of the low-side switch LG. The low-side overcurrent protecting circuit 400 may detect the data of the node LX to determine whether or not the current IL that flows through the low-side switch LG, the node LX and the inductor L is larger than a second current threshold to output a low-side overcurrent detected signal OCL, within the minimum off time Toffmin of the minimum off time signal TFM.

That is, when the current IU flows toward the inductor L through the node LX from the high-side switch UG being turned on and the current IU is larger than the first current threshold, an overcurrent event occurs. Under this condition, a time length of the minimum off time Toffmin of the minimum off time signal TFM is adjusted to be equal to a time length of the second minimum reference off time. The time length of the second minimum reference off time is longer than a time length of the first minimum reference off time. As a result, the low-side overcurrent protecting circuit 400 has sufficient time to determine whether or not the current IL that flows through the low-side switch LG, the node LX and the inductor L is larger than the second current threshold. That is, the low-side overcurrent protecting circuit 400 has sufficient time to determine whether or not the overcurrent event occurs when the low-side switch LG is turned on. Therefore, when the overcurrent event occurs, appropriate operations can be immediately performed to prevent the circuit components of the power converter from being damaged by an overcurrent.

Figure 2:
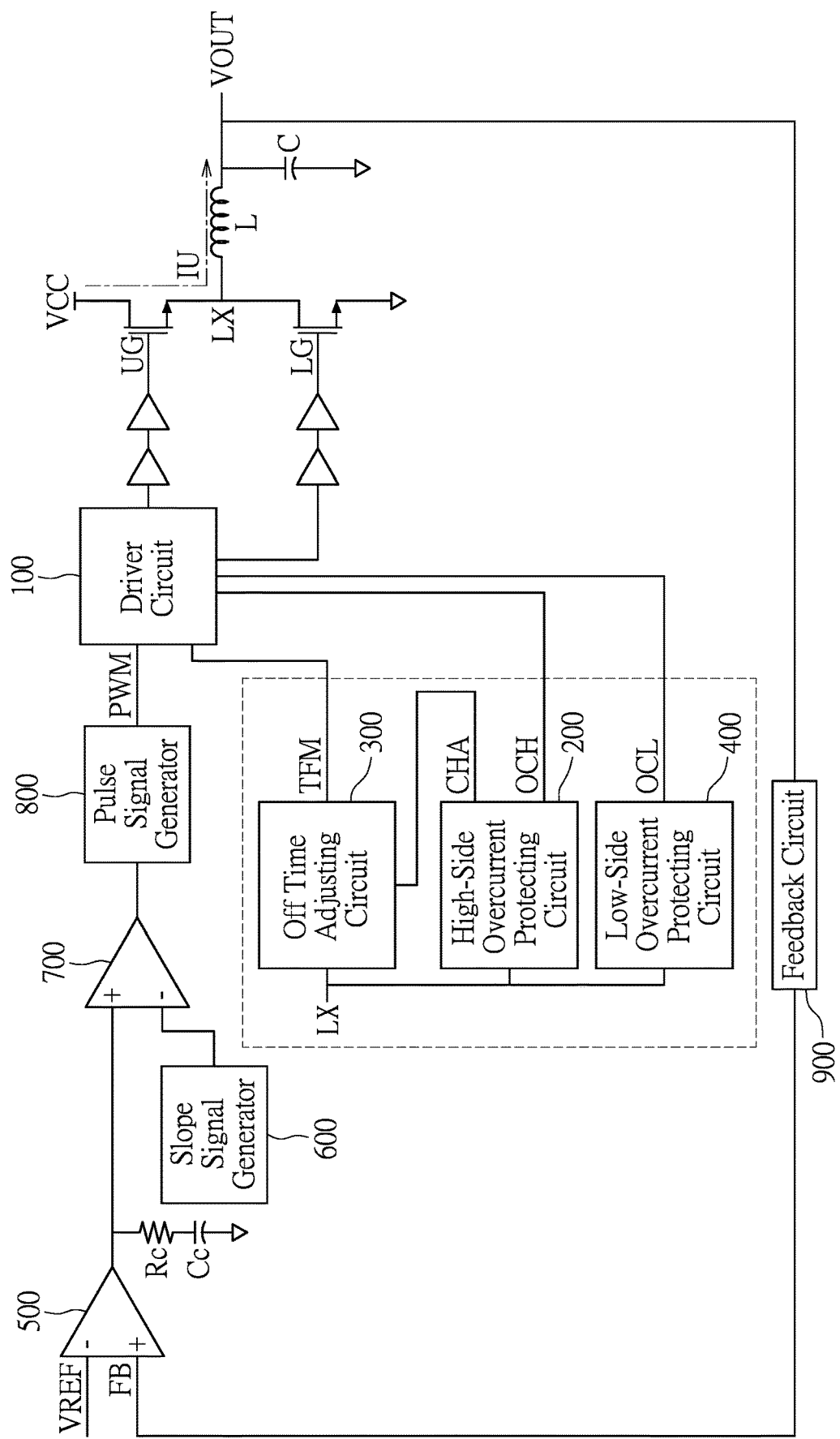
FIG. 2 is a circuit layout diagram of a power converter having a mechanism of dynamically controlling a minimum off time according to a second embodiment of the present disclosure.

Reference is made to FIG. 2, which is a circuit layout diagram of a power converter having a mechanism of dynamically controlling a minimum off time according to a second embodiment of the present disclosure.

In the second embodiment of the present disclosure, the power converter may include the high-side switch UG, the low-side switch LG, the driver circuit 100, the high-side overcurrent protecting circuit 200, the off time adjusting circuit 300 and the low-side overcurrent protecting circuit 400. The same descriptions of the first and second embodiments are not repeated herein.

A difference between the first and second embodiments is that, the power converter of the second embodiment further includes an operational amplifier 500, a slope signal generator 600, a comparator 700, a pulse signal generator 800 and a feedback circuit 900, but the present disclosure is not limited thereto.

An input terminal of the feedback circuit 900 may be connected to the node between the second terminal of the inductor L and the first terminal of the inductor L. The node may be used as the output terminal of the power converter. The feedback circuit 900 may detect a voltage of the node (that is, an output voltage of the output terminal of the power converter) as a feedback voltage FB. A first terminal such as an inverting input terminal of the operational amplifier 500 may be coupled to a reference voltage VREF. A second terminal such as a non-inverting input terminal of the operational amplifier 500 may be connected to an output terminal of the feedback circuit 900 and receive the feedback voltage FB of the output terminal of the power converter from the feedback circuit 900.

The operational amplifier 500 may multiply a difference between the feedback voltage FB of the output terminal of the power converter and the reference voltage VREF by a gain to output an amplified signal. An output terminal of the operational amplifier 500 may be connected to a first terminal of a resistor Rc. A second terminal of the resistor Rc may be connected to a first terminal of a capacitor Cc. A second terminal of the capacitor Cc may be grounded.

A first terminal such as a non-inverting input terminal of the comparator 700 may be connected to the output terminal of the operational amplifier 500. A second terminal such as an inverting input terminal of the comparator 700 may be connected to an output terminal of the slope signal generator 600. The comparator 700 may compare a voltage of the amplified signal outputted by the operational amplifier 500 (that is a voltage of the first terminal of a resistor Rc) with a voltage of a slope signal generated by the slope signal generator 600 to output a comparing signal.

The pulse signal generator 800 may be connected to an output terminal of the comparator 700 and an input terminal of the driver circuit 100. The pulse signal generator 800 may output a pulse width modulation signal PWM to the driver circuit 100 according to the comparing signal from the comparator 700. The driver circuit 100 may output the high-side conduction signal UGS to the high-side switch UG and output the low-side conduction signal LGS to the low-side switch LG as described above, according to the pulse width modulation signal PWM.

In conclusion, the present disclosure provides the power converter having the mechanism of dynamically controlling the minimum off time. When the power converter normally operates, the minimum off time of the low-side switch is shorter. However, when the current flowing through the high-side switch is larger than the first current threshold, the overcurrent event occurs. Under this condition, the minimum off time of the low-side switch is longer. When the low-side switch is turned on during the longer minimum off time, the low-side overcurrent protecting circuit has sufficient time to determine whether or not the current flowing through the low-side switch is larger than the second threshold. That is, the low-side overcurrent protecting circuit has sufficient time to determine whether or not the overcurrent event occurs. Therefore, the circuit components of the power converter can be prevented from being damaged due to the overcurrent event.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a mechanism of dynamically controlling a minimum off time, comprising:
   a high-side switch, wherein a first terminal of the high-side switch is coupled to a common voltage;
   a low-side switch, wherein a first terminal of the low-side switch is connected to a second terminal of the high-side switch, a node between the second terminal of the high-side switch and the first terminal of the low-side switch is connected to a first terminal of an inductor, a second terminal of the inductor is connected to a first terminal of a capacitor, and a second terminal of the capacitor and a second terminal of the low-side switch are grounded;
   a driver circuit connected to a control terminal of the high-side switch and a control terminal of the low-side switch, wherein the driver circuit is configured to output a high-side conduction signal to the high-side switch to drive the high-side switch, and to output a low-side conduction signal to the low-side switch to drive the low-side switch;
   a high-side overcurrent protecting circuit connected to the driver circuit and the node between the second terminal of the high-side switch and the first terminal of the low-side switch, wherein the high-side overcurrent protecting circuit is configured to detect the node to determine whether or not a current flows from the high-side switch through the node toward the inductor, and the high-side overcurrent protecting circuit is configured to determine whether or not the current is larger than a first current threshold to output a high-side overcurrent detected signal to the driver circuit and to output a high-side overcurrent protecting signal; and
   an off time adjusting circuit connected to the high-side overcurrent protecting circuit and the driver circuit, wherein the off time adjusting circuit is configured to determine a minimum off time of a minimum off time signal according to the high-side overcurrent protecting signal, and configured to output the minimum off time signal to the driver circuit;
   wherein, when the driver circuit determines that an overcurrent event occurs and the high-side switch is turned on according to the high-side overcurrent detected signal, the driver circuit continually turns on the low-side switch at least during a long minimum off time of the minimum off time signal.

2. The power converter according to claim 1, wherein the off time adjusting circuit stores a plurality of minimum reference off times, the off time adjusting circuit selects one of the plurality of minimum reference off times according to the high-side overcurrent protecting signal, and the off time adjusting circuit outputs the minimum off time signal having the minimum off time that is equal to the one of the plurality of minimum reference off times.

3. The power converter according to claim 1, wherein the off time adjusting circuit determines a working period and a non-working period of the minimum off time signal according to the high-side overcurrent protecting signal and then outputs the minimum off time signal, and the non-working period of the minimum off time signal includes the minimum off time.

4. The power converter according to claim 1, wherein the off time adjusting circuit stores a first minimum reference off time, and when the power converter does not generate the current or the current is not larger than the first current threshold, the off time adjusting circuit outputs the minimum off time signal having the minimum off time that is equal to the first minimum reference off time.

5. The power converter according to claim 4, wherein the off time adjusting circuit further stores a second minimum reference off time, and when the power converter generates the current and the current is larger than the first current threshold, the off time adjusting circuit outputs the minimum off time signal having the minimum off time that is equal to the second minimum reference off time.

6. The power converter according to claim 1, wherein, when the power converter generates the current and the current is larger than the first current threshold, the high-side overcurrent protecting circuit outputs the high-side overcurrent detected signal having a pulse wave and outputs the high-side overcurrent protecting signal having a waveform.

7. The power converter according to claim 6, wherein a rising edge of the waveform of the high-side overcurrent protecting signal is aligned with a rising edge of the pulse wave of the high-side overcurrent detected signal, and a falling edge of the waveform of the high-side overcurrent protecting signal is aligned with a next rising edge of a waveform of the high-side conduction signal.

8. The power converter according to claim 1, wherein the minimum off time is a time between a time point of a rising edge of the low-side conduction signal and a time point of a rising edge of the minimum off time signal.

9. The power converter according to claim 1, wherein, when the low-side switch receives the low-side conduction signal at a low level, the low-side switch is turned off, and when the low-side switch receives the low-side conduction signal at a high level, the low-side switch is turned on.

10. The power converter according to claim 1, further comprising:
a low-side overcurrent protecting circuit connected to the driver circuit and the node, wherein the low-side overcurrent protecting circuit is configured to determine whether or not a current that flows through the low-side switch, the node and the inductor is larger than a second current threshold, within the minimum off time.

* * * * *